United States Patent [19]

Papathomas et al.

[11] Patent Number: 5,015,719

[45] Date of Patent: May 14, 1991

[54] AROMATIC DICYANATE/AROMATIC DIEPOXY COMPOSITIONS, CURED PRODUCTS AND METHODS

[75] Inventors: Kostas I. Papathomas, Endicott; William J. Summa, Endwell; David W. Wang, Vestal, all of N.Y.

[73] Assignee: International Business Machines Corporation, Armonk, N.Y.

[21] Appl. No.: 380,195

[22] Filed: Jul. 14, 1989

Related U.S. Application Data

[60] Continuation-in-part of Ser. No. 154,861, Feb. 10, 1988, which is a division of Ser. No. 33,557, Apr. 3, 1987, Pat. No. 4,745,215.

[51] Int. Cl.$^5$ .............................................. C08G 22/14
[52] U.S. Cl. ...................................... 528/70; 528/67; 528/59; 428/423.1; 428/418

[58] Field of Search .............................. 528/59, 67, 70; 428/423.1, 418

[56] References Cited

U.S. PATENT DOCUMENTS 3,463,762  8/1969  Trischler .............................. 528/70

*Primary Examiner*—John Kight, III
*Assistant Examiner*—Dvc Truong
*Attorney, Agent, or Firm*—Perman & Green

[57] ABSTRACT

Dicyanato diphenyl fluorinated alkane resin precursor compositions are modified by the addition of minor predetermined amounts of aromatic diepoxides having high epoxide equivalent weights in order to reduce the curing temperature of prepregs and laminates, such as circuit boards, while retaining low dielectric constants, heat stability and high flame retardance.

31 Claims, 1 Drawing Sheet

AROMATIC DICYANATE/AROMATIC DIEPOXY COMPOSITIONS, CURED PRODUCTS AND METHODS

This is a continuation-in-part of copending application Ser. No. 154,861 filed Feb. 10, 1988, which is a division of Ser. No. 33,557 filed Apr. 3, 1987, now U.S. Pat. No. 4,745,215.

BACKGROUND OF THE INVENTION

I. Field of the Invention

This invention relates to fluorine-containing aromatic dicyanate resin compositions capable of being cured at reduced temperatures to form products such as coatings or coatings having low dielectric constants ranging between about 2.8 and 3.1 at 817 MHz, and/or prepregs and laminates having low dielectric constants ranging between about 3.8 and 4.0, high degradation temperatures, thermal stability and flame retardance properties. According to preferred embodiments, this invention relates to the preparation of curable resin compositions for impregnating reinforcing fabrics to form prepregs which are laminated and cured at about 190° to 270° C. in association with conductive metal layers to form circuit boards, the laminates having dielectric constants below about 4.0, glass transition temperatures above about 215° C. and thermal degradation temperatures above 400° C.

II. Description of the Prior Art

It is known, such as from the aforementioned U.S. Pat. No. 4,745,215, that dicyanato diphenyl hexafluorinated alkanes can be impregnated into suitable reinforcing fabrics and heat cured at elevated temperatures above their glass transition temperatures, i.e., about 320° C. for 1 hour. The cured products have excellent properties for high temperature and/or electrical insulation uses, such as in laminated circuit boards. These properties include low dielectric constants, high glass transition temperatures and high thermal degradation temperatures. However the high glass transition temperatures require that the compositions be cured at high temperatures which, in the case of circuit board laminates, requires the use of high temperature lamination presses which is an important disadvantage with respect to manufacturing time and expense.

It is also known to prepare prepregs from dicyanate resins and polyester resins as taught by West German Patent 3,413,547, the use of mixtures of dicyanates including 6F dicyanate, which is hexafluoro-2,2-bis-(4-isocyanato phenyl) propane, being disclosed.

It is known to produce non-fluorinated cyanurate polymers and compositions containing mixtures of such polymers with other polymers to provide compositions having relatively low curing temperatures. Such compositions are burnable unless the added polymer(s) has flame retardant properties and/or unless flame retardency-imparting ingredients are added. Moreover, while the added polymer(s) substantially reduce the normally-higher glass transition temperature and curing temperature of the mixed polymer compositions, they often result in compositions having substantially higher dielectric constants than the normally lower dielectric constant of the cyanurate polymer, per se. Moreover the heat stability and degradation temperature of such mixed polymer compositions generally are reduced to the point that laminates thereof, such as circuit boards, cannot withstand high temperature excursions in the range of 340°–360° C. for even short periods of time (10–15 minutes). Reference is made to U.S. Pat. Nos. 4,477,629; 4,665,154; 4,740,584 and 4,782,116.

Among the resins frequently blended with dicyanate polymers to produce prepreg and reinforced laminate compositions for circuit boards are the lower molecular weight bisphenol A diglycidyl ether epoxy resins, including bromine-substituted resins for imparting some degree of flame resistance as disclosed by U.S. Pat. No. 4,782,116. Such epoxy resins are of relatively low equivalent weight, using non brominated resin for example, so that the epoxy group and possibly the hydroxy group contents are relatively high, i.e., each relatively short repeating unit contains two functional groups, which results in an increase in the dielectric constant of the compositions after curing. Some proposed mixtures contain substantial amounts of the epoxy resin relative to the dicyanate polymer(s), producing an even higher dielectric constant. Also in such compositions the thermal stability or heat resistance of the cured prepregs or laminates is unsatisfactory in high temperature processing applications.

SUMMARY OF THE INVENTION

The present invention relates to the preparation of fluorine-containing aromatic dicyanate/aromatic diepoxy polymer compositions which have a dielectric constant between about 2.8 and 3.1 and therefor retain, as closely as possible, the excellent low dielectric constant properties of the aromatic dicyanate polymer, as well as flame retardant properties thereof, while reducing the glass transition temperature (Tg) and processing or curing temperature to enable prepregs and circuit board laminates to be fabricated and cured at substantially lower temperatures i.e. at about 190°–270° C., preferably 220–250° C., without substantially reducing the thermal stability of the cured resin system.

These objectives have been accomplished by the discovery that certain minor amounts of certain higher molecular weight triphenyl epoxy resin precursors can be blended with fluorinated phenyl dicyanate compounds or pre-polymers to produce compositions which are curable at substantially lower temperatures than the dicyanate polymer, per-se, and which form prepreg composites and circuit board laminates having low dielectric constants, only slightly higher than those of the cured dicyanate polymer, per se, excellent flame retardant properties, and good thermal stability evidenced by degradation temperatures above about 400° C.

THE DRAWINGS

FIG. 1 is a graph illustrating the reduction of the glass transition temperature (Tg) of the present fluorine-containing aromatic dicyanate/aromatic diepoxy resin mixtures, cured at 250° C. for one hour, as the weight percentage of the aromatic diepoxy component is increased u to 40%; and FIG. 2 is a graph illustrating the reduction of the degradation temperature (Td) of the present fluorine-containing aromatic dicyanate/aromatic diepoxy resin mixtures, similarly cured, as the weight percentage of the aromatic diepoxy component is increased up to 40%.

DETAILED DESCRIPTION

Figure 1:
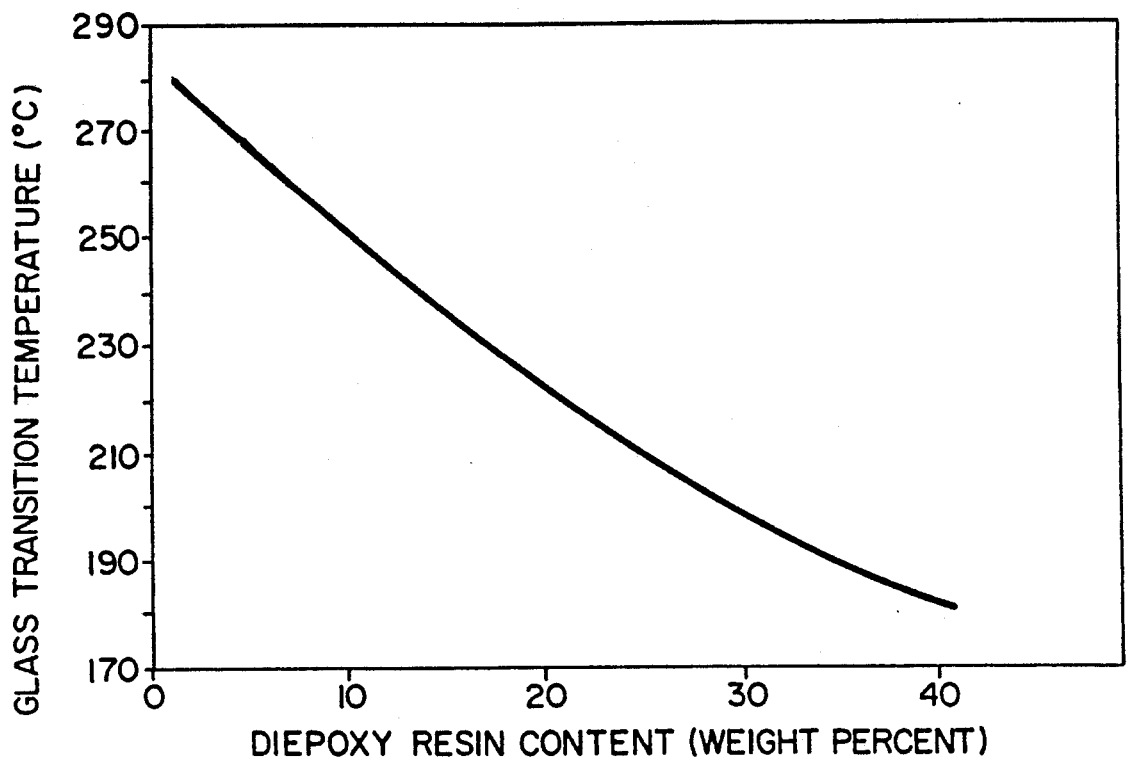
Figure 2:
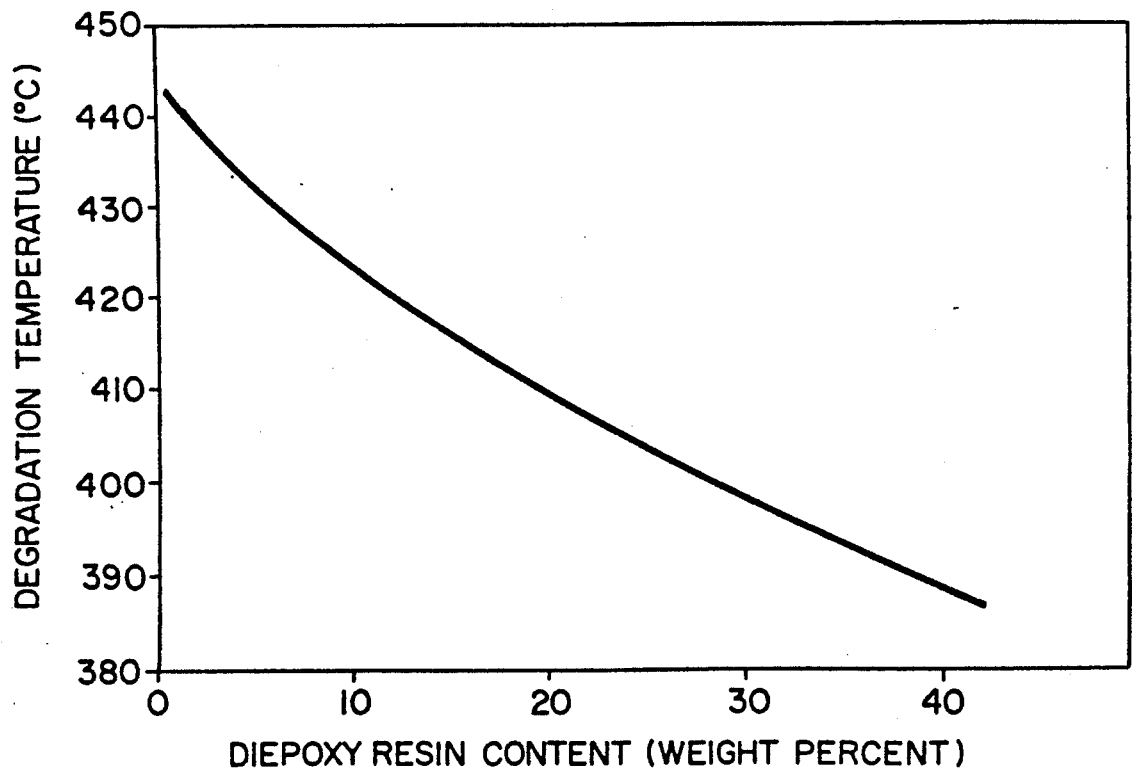

The present invention is based upon the discovery that certain high molecular weight epoxy resin precursors having an epoxide equivalent weight of from about 240 to 255 can be blended with dicyanato diphenyl fluorinated alkane monomers or prepolymers to produce a composition which, on curing at temperatures below about 270° C., does not undergo a substantial increase in the dielectric constant. The high epoxide equivalent weight of the particular epoxy resins represents a reduction or dilution of reactive epoxy groups in the epoxy resin as compared to the conventional diglycidyl ether diphenyl methanes such as bisphenol A diglycidyl ether which has an epoxy equivalent weight of about 185–200, i.e., a greater number of epoxide groups which produce a higher cross-linking density during curing and result in a higher glass transition temperature in the cured polymer blend and an increased dielectric constant.

The novel dicyanate-epoxy blend compositions of the present invention can be formulated, impregnated into conventional E-glass fabric and cured to form prepregs or laminates, such as circuit boards, having a glass transition temperature as low as about 215° C. The blends appear to have dielectric constant gain of about 0.5 or less as compared to that of the pure dicyanate in cured condition.

Fluorine-containing aromatic dicyanates generally polymerize by cyclotrimerization to form highly cross-linked heterochain polymers having high temperature stability, low dielectric constants, high glass transition temperatures and flame retardance ratings of V-0 (UL94).

Blending of the present fluorine-containing aromatic dicyanates with minor amounts, from about 5% up to about 25% by weight of the mixture, of aromatic epoxy prepolymers having the formula:

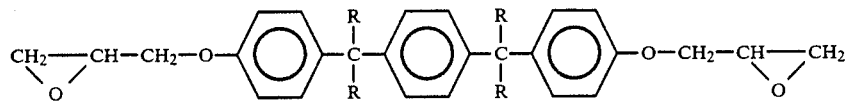

, where R is H or lower alkyl, preferably methyl, causes the epoxide groups to react with excessive aromatic cyanate groups in the mixture to form oxazoline-type structures during cross-linking or curing, thereby eliminating or substantially reducing the number of hydroxy groups normally formed during the curing of epoxy resins.

The preferred epoxy resin precursor is diglycidyl-α, α'-bis (4-hydroxyphenyl)-p-diisopropyl benzene which has the formula given hereinabove, in which each R group is an alkyl group preferably having from 1 to about 8 carbon atoms, most preferably a methyl group.

The presence of epoxide resins having a shorter linking unit between functional groups results in the formation of larger numbers of polar groups in the cured resin and a substantial increase in the dielectric constant. Polymers containing more than about 25% by weight of the epoxy component are not satisfactory for prepregs and circuit boards requiring low dielectric constant and high thermal stability properties or flame retardance ratings of UL94 V-0 or V-1.

The preferred aromatic dicyanates used according to the present invention are the fluorine-containing dicyanates disclosed in parent application 33,557 filed Apr. 3, 1987, now U.S. Pat. No. 4,745,215, most particularly 6-F bisphenol A dicyanate. Such material, impregnated into conventional E-glass reinforcing fabric and cured at 240° C., has a glass transition temperature of about 240°–260° C., a dielectric constant of about 3.3 to 3.8, moisture absorption of 0.45% at room temperature and thermal stability represented by a 1.0% weight loss at 350° C. and 7.8% at 400° C. (isothermal, 1 hour) and a thermal degradation temperature of about 450° C. Moreover such material is flame retardant and has a U.L. flammability rating of UL94 V-0.

The similar non-fluorinated aromatic dicyanates cannot be used according to the present invention since they require the addition of conventional flame retardant materials such as halogenated poly(vinyl benzyl ether) or brominated diphenyl ether in order to impart flame retardant properties, and such additives substantially influence the dielectric constant.

However, non-fluorinated aromatic dicyanates such as bisphenol A dicyanate can be used in admixture with the fluorinated dicyanates.

In addition to the fluorinated dicyanate and epoxy resin precursor, the present compositions also preferably include a suitable conventional polymerization catalyst such as zinc octanoate. For prepreg or laminate use, the compositions are impregnated into suitable conventional reinforcing fabrics, or chopped fibers such as glass, aramid, quartz, polytetrafluoroethylene, polyphenylene benzobisoxazole, polyphenylene-benzobisthiazole, or combinations thereof.

The preferred compositions of the present invention contain about 80% by weight of the dicyanato diphenyl fluoroalkane monomer or prepolymer AROCY F-40S available from Hi-Tek Polymers, Inc. and about 20% by weight of the epoxy component, since such compositions provide flame retardance ratings of UL94 V-0 after impregnation into reinforcing fabric such as E-glass. When the epoxy content is raised to about 25% the flame retardance rating drops to UL-94 V-1. When the epoxy content is reduced below about 10%, the flame retardance rating is UL94 V-0.

In addition compositions of the present invention containing 80% by weight of the dicyanato diphenyl fluoroalkane monomer and about 20% by weight of the epoxy component, exhibit flammability rating UL94 V-0 and a dielectric constant of 2.8 at 817 MHz when cured at 180° C. for two hours and post baked at 220 for one hour.

When the epoxy content is raised to 25% the dielectric constant is raised to 2.9 but the flame retardancy rating drops to UL94 V-1. Similarly if the epoxy content reaches 30% the dielectric constant of the blend is increased to 3.1 and does not meet the UL94 V-1 flammability rating.

Having described the basic concepts of the present invention, reference is now made to the following examples, which are provided by way of illustration, and not by way of limitation, of the practice of the present invention. All parts and percents are by weight unless otherwise specified.

EXAMPLE 1

A resin casting 60 mils thick was prepared by mixing 160 grams of hexafluorobisphenol A dicyanate (dicyanato diphenyl hexafluoro isopropane) monomer, commercially available from Hi-Tek Polymers, Inc.

under the trademark ESR 324, and 40 grams of diglycidyl-α, α'-bis-(4-hydroxyphenyl)-p-diisopropyl benzene commercially available from Shell Chemical Company under the designation RSL-1107 (epoxide equivalent weight 240–255), and 0.2 grams of zinc octanoate catalyst (8%, zinc content).

The resin mixture was heated to 120° C. to produce a pourable liquid and poured between two flat pieces of 2 oz copper separated with a rubber spacer 60 mils thick supported between two 6×6 in glass plates. The resin casting was cured at 180° C. for 2 hours and post cured at 220° C. for 1 hour.

The resulting laminate structure exhibits a glass transition temperature of about 225° C. measured by differential scanning colorimetry, a dielectric constant of 2.8 measured at 817 MHz, and the resin casting has a flammability rating of UL94 V-0.

EXAMPLE 2

A resin casting 60 mils thick was prepared by mixing 140 grams of hexafluorobisphenol A dicyanate (dicyanato diphenyl hexafluoro isopropane) monomer commercially available from Hi-Tek Polymers, Inc. under the trademark ESR 324 and 60 grams of diglycidyl-α, α',-bis-(4-hydroxyphenyl)-p-diisopropyl benzene commercially available from Shell Chemical Company under the designation RSL-1107 (epoxide equivalent weight 240–255), and 0.2 grams of zinc octanoate catalyst (8% zinc content).

The resin mixture was heated at 120° C. to produce a liquid and poured between two flat pieces of 2 oz copper separated with a rubber spacer 60 mils thick supported between two 6×6 in glass plates. The resin casting was cured at 220° C. for 2 hours.

The molded structure has a glass transition temperature of about 215° C. measured by differential scanning calorimetry, a dielectric constant of 3.1 measured at 817 MHz but the resin casting does not meet the flammability rating of UL94 V-1.

EXAMPLE 3

A resin precursor blend solution was prepared by mixing 318 g of hexafluorobisphenol A dicyanate (dicyanato diphenyl hexafluoro isopropane) prepolymer commercially available from Hi-Tek Polymers, Inc. under the trademark AROCY F-40S (75% solution in methyl ethyl ketone) and 60 grams of diglycidyl-α, α'-bis(4-hydroxyphenyl)-pdiisopropyl benzene commercially available from Shell Chemical Company under the designation RSL-1107 (epoxide equivalent weight 240–255), and 0.25 grams of zinc octanoate catalyst (8%, zinc content) and 100 grams of methyl ethyl ketone solvent.

The resin solution is impregnated into a conventional 108 style, E-glass reinforcing fabric for preparing B-staged prepregs, using an impregnation treater. Several layers of the fabric are superposed with one or more sheets of copper to form a laminate which is then cured under pressure at a temperature of about 180°–220° C. to produce a copper clad laminate or circuit board which is ready for circuitization.

The laminates, containing about 56% glass and about 44% resin, of which 35% is AROCY F-40S and 9% is the epoxy component, have a flame retardancy or flammability rating of UL94 V-0, a glass transition temperature of about 245° C. by thermomechanical analysis (TMA), and a dielectric constant of 3.95 measured at 580 MHz.

EXAMPLE 4

Similar to procedures described in Example 3, a prepreg was obtained by impregnating a 108 style, E-glass fabric with a resin mixture of 280 grams of hexafluoro bisphenol A dicyanate prepolymer (AROCY F-40S, Hi-Tek Polymers), 90 grams of diglycidyl-α, α'-bis-(4-hydroxyphenyl)-p-diisopropyl benzene (RSL-1107, Shell Chemical Co.), 100 grams of methyl ethyl ketone, and 0.2 grams of zinc octanoate (8% zinc content).

B-staged prepregs were cured under heat and pressure to form laminates. The laminates, containing about 48% glass, 36% AROCY F-40S and 16% epoxy component, do not meet UL94 V-1 flammability rating.

EXAMPLE 5

Similar to procedures described in Example 3. A prepreg was obtained by impregnating a 108 style, E-glass fabric with a resin mixture of 300 grams of hexafluoro bisphenol A dicyanate prepolymer (AROCY F-40S Hi-Tek Polymers Inc.), 75 grams of diglycidyl-α, α'-bis-(4-hydroxyphenyl)- p-diisopropyl benzene (RSL-1107, Shell Chemical Co.), 100 grams of methyl ethyl ketone, and 0.2 grams of zinc octanoate (8% zinc content).

B-staged prepregs were cured under heat and pressure to form laminates. The laminates, containing about 56% glass, 33% AROCY F-40S and 11% epoxy component, were tested for flame retardancy and exhibit UL94 V-1 flammability rating. The dielectric constant was measured to be about 4.0.

EXAMPLE 6

The resin composition prepregs of Examples 3 to 5 can be used to prepare circuit board laminates suitable for circuitization by combining several layers of the resin-impregnated reinforcing fabric with a suitable sheet or layer of electroconductive metal, such as copper, and molding the composite structures under sufficient heat and pressure to cure the prepregs and form copper-clad laminates suitable for circuitization.

Although variations are shown in the present application, many modifications and ramifications will occur to those skilled in the art upon a reading of the present disclosure. These, too, are intended to be included herein within the scope of the following claims.

We claim:

1. Resin composition which is heat-curable at temperatures between about 190° and 270° C., has a dielectric constant between about 2.8 and 3.1, a glass transition temperature between about 215° and 270° C., flame retardance and substantial heat stability evidenced by a degradation temperature between about 400° and 430° C., said composition containing a mixture of reactive monomers and/or prepolymers comprising a major amount by weight of a dicyanato diphenyl fluoroalkane and a minor amount by weight of an aromatic diepoxide having an epoxide equivalent weight between about 240 and 255.

2. A composition according to claim 1 in which said fluoroalkane comprises a dicyanato diphenyl hexafluoro isopropane.

3. A composition according to claim 2 in which said fluoroalkane comprises the 4,4' dicyanato hexafluoro bisphenol A.

4. A composition according to claim 1 in which said aromatic diepoxide comprises a linear bis(hydroxyphenyl)-p-dialkyl benzene diepoxide.

5. A composition according to claim 4 in which said aromatic diepoxide comprises a diglycidyl-bis-phenol-p-dialkyl benzene or an oligomer thereof.

6. A composition according to claim 5 in which said aromatic diepoxide comprises diglycidyl α, α'-bis(4-hydroxyphenyl)-p-diiospropyl benzene.

7. A composition according to claim 1 in which said mixture comprises from about 75% to 95% by weight of said fluoroalkane monomer or prepolymer and from about 5% to 25% by weight of said aromatic diepoxide.

8. A composition according to claim 7 in which said mixture comprises from about 80% to 90% by weight of said fluoroalkane monomer and from about 10% to 20% by weight of said aromatic diepoxide whereby said composition is curable at a temperature between about 190° and 270° C. to produce cured prepregs or laminates having a dielectric constant less than 4.0, a glass transition temperature between about 215° and 260° C., and a degradation temperature between about 410° and 425° C. and a flame retardancy rating of UL94 V-0 to V-1.

9. A composition according to claim 8 in which said fluoroalkane comprises a dicyanato diphenyl hexafluoro isopropane.

10. A composition according to claim 8 in which said aromatic diepoxide comprises a diglycidyl-bis-phenol-p-dialkyl benzene or an oligomer thereof.

11. A prepreg which is heat-curable at temperatures between about 190° and 270° C. to have a dielectric constant less than 4.0, a glass transition temperature between about 215° and 260° C. flame retardance and substantial heat stability evidenced by a degradation temperature between about 400° and 430° C., said prepreg comprising a reinforcing fabric impregnated with a composition containing a mixture of reactive prepolymers comprising a major amount by weight of a dicyanato diphenyl fluoroalkane and a minor amount by weight of an aromatic diepoxide having an epoxide equivalent weight between about 240 and 255.

12. A prepeg according to claim 11 in which said fluoroalkane comprises a dicyanato diphenyl hexafluoro isopropane or an oligomer thereof.

13. A prepreg according to claim 12 in which said fluoroalkane comprises the 4,4-dicyanato hexafluoro bisphenol A.

14. A prepreg according to claim 11 in which said aromatic diepoxide comprises a linear bis(hydroxyphenyl)-p-dialkyl benzene diepoxide.

15. A prepreg according to claim 14 in which said aromatic diepoxide comprises a diglycidyl-bis-phenol-p-dialkyl benzene or an oligomer thereof.

16. A prepreg according to claim 15 in which said aromatic diepoxide comprises diglycidyl-α, α'-bis-(4-hydroxyphenyl)-p-diiospropyl benzene.

17. A prepreg according to claim 11 in which said mixture comprises from about 75% to 95% by weight of said fluoroalkane and from about 5% to 25% by weight of said aromatic diepoxide.

18. A. prepreg according to claim 17 in which said mixture comprises from about 80% to 90% by weight of said fluoroalkane and from about 10% to 20% by weight of said aromatic diepoxide whereby said composition is curable at a temperature between about 190° and 270° C. to produce cured prepregs or laminates having a dielectric constant less than 4.0, a glass transition temperature between about 215° and 260° C. and a degradation temperature between about 400° and 425° C.

19. A prepreg according to claim 18 in which said fluoroalkane comprises a dicyanato diphenyl hexafluoro isopropane.

20. A prepreg according to claim 18 in which said aromatic diepoxide comprises diglycidyl-bis-phenol-p-dialkyl benzene or an oligomer thereof.

21. A circuit board comprising a laminate of at least one prepreg according to claim 11 and at least one layer of a conductive metal bonded thereto to form a composite structure suitable for circuitization.

22. A circuit board according to claim 21 comprising a laminate of at least one prepreg comprising a reinforcing fabric impregnated with a composition containing a mixture of from about 75% to 95% by weight of a dicyanato diphenyl hexafluoro isopropane and from about 5% to 25% by weight of a linear triphenyl alkane diepoxide having an epoxide equivalent weight between about 240 and 255, and at least one layer of a conductive metal bonded thereto to form a composite structure suitable for circuitization.

23. A circuit board according to claim 22 comprising from about 80% to 90% by weight of said fluorinated isopropane and from about 10% to 20% by weight of said diepoxide.

24. A method for producing a resin composition which is heat-curable at temperatures between about 190° and 270° C., has a dielectric constant between about 2.8 and 3.1, a glass transition temperature between about 215° and 260° C, flame retardance and substantial heat stability evidenced by a degradation temperature between about 400° and 430° C., comprising reacting a major amount by weight of a dicyanato diphenyl fluoroalkane monomer or prepolymer and a minor amount by weight of an aromatic diepoxide having an epoxide equivalent weight between about 240 and 255.

25. Method according to claim 24 in which said fluoroalkane comprises a dicyanato diphenyl hexafluoro isopropane.

26. Method according to claim 25 in which said fluoroalkane comprises the 4,4 dicyanato hexafluoro bisphenol A.

27. Method according to claim 24 in which said aromatic diepoxide comprises a linear bis(hydroxyphenyl)-p-dialkyl benzene diepoxide.

28. A composition according to claim 27 in which said aromatic diepoxide comprises a diglycidyl-bis-phenol-p-dialkyl benzene or an oligomer thereof.

29. Method according to claim 28 in which said aromatic diepoxide comprises diglycidyl α, α'-bis(4-hydroxyphenyl)-p-diiospropyl benzene.

30. Method according to claim 24 in which said mixture comprises from about 75% to 95% by weight of said fluoroalkane monomer or prepolymer and from about 5% to 25% by weight of said aromatic diepoxide.

31. Method according to claim 30 in which said mixture comprises from about 80% to 90% by weight of said fluoroalkane monomer and from about 10% to 20% by weight of said aromatic diepoxide, impregnating said composition into a reinforcing fabric and curing at a temperature between about 230° and 250° C. to produce cured prepregs or laminates having a dielectric constant less than 4.0, a glass transition temperature between about 215° and 260° C., and a degradation temperature between about 410° and 425° C. and a flame retardancy rating of UL94 V-0 to V-1.

* * * * *